US012622076B2

(12) United States Patent
Fujisawa et al.

(10) Patent No.: US 12,622,076 B2
(45) Date of Patent: May 5, 2026

(54) INFRARED SENSOR AND METHOD OF MANUFACTURING INFRARED SENSOR

(71) Applicant: Mitsubishi Electric Corporation, Tokyo (JP)

(72) Inventors: Daisuke Fujisawa, Tokyo (JP); Takashi Takenaga, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 723 days.

(21) Appl. No.: 17/924,115

(22) PCT Filed: Jul. 3, 2020

(86) PCT No.: PCT/JP2020/026226
§ 371 (c)(1),
(2) Date: Nov. 9, 2022

(87) PCT Pub. No.: WO2022/003959
PCT Pub. Date: Jan. 6, 2022

(65) Prior Publication Data
US 2023/0187459 A1 Jun. 15, 2023

(51) Int. Cl.
H10F 39/00 (2025.01)
H04N 23/23 (2023.01)
(Continued)

(52) U.S. Cl.
CPC .............. H10F 39/80 (2025.01); H04N 23/23 (2023.01); H10F 39/184 (2025.01);
(Continued)

(58) Field of Classification Search
CPC ...... H10F 39/80; H10F 39/804; H10F 39/184; H10F 39/1843; H10F 39/193; H10F 39/1935
See application file for complete search history.

(56) References Cited

U.S. PATENT DOCUMENTS 10,453,832 B2 * 10/2019 Wu ......................... H01L 24/29
2004/0095495 A1 5/2004 Inokuma et al.
(Continued)

FOREIGN PATENT DOCUMENTS

CN 102610619 A 7/2012
EP 3961260 A1 * 3/2022 ............. G02F 1/295
(Continued)

OTHER PUBLICATIONS

Chinese Office Action mailed Jul. 27, 2024 for Chinese Application No. CN202080102395.X (12 pages; with English translation).
(Continued)

*Primary Examiner* — Matthew E Warren
(74) *Attorney, Agent, or Firm* — XSENSUS LLP

(57) ABSTRACT

An infrared sensor includes a first semiconductor substrate, a second semiconductor substrate, a sealing frame, and a first connection. The first semiconductor substrate includes a first main surface and an infrared detection element. The second semiconductor substrate includes a second main surface and a signal processing circuit. The sealing frame surrounds an internal space with the first main surface, the infrared detection element, and the second main surface. The first connection electrically connects the infrared detection element and the signal processing circuit. The internal space is hermetically sealed by the first main surface, the infrared detection element, the second main surface, and the sealing frame. Each of the sealing frame and the first connection is sandwiched between the first main surface and the second main surface.

17 Claims, 16 Drawing Sheets

(51) Int. Cl.
H10F 39/12 (2025.01)
H10F 39/18 (2025.01)

(52) U.S. Cl.
CPC ....... H10F 39/1843 (2025.01); H10F 39/193
(2025.01); H10F 39/1935 (2025.01); H10F
39/804 (2025.01)

(56) References Cited

U.S. PATENT DOCUMENTS

| | | | | |
|---|---|---|---|---|
| 2008/0179503 | A1 | 7/2008 | Camargo et al. | |
| 2009/0200629 | A1* | 8/2009 | Asami ................... | H10F 39/026 |
| | | | | 257/E31.118 |
| 2010/0288525 | A1* | 11/2010 | Basavanhally ....... | H01L 23/055 |
| | | | | 156/273.9 |
| 2015/0321905 | A1* | 11/2015 | Gooch ...................... | G01J 5/20 |
| | | | | 257/433 |
| 2018/0337160 | A1* | 11/2018 | Drab ................... | H01L 25/0657 |
| 2022/0162062 | A1* | 5/2022 | Ang .................... | B81C 1/00238 |
| 2022/0196480 | A1* | 6/2022 | Ang ........................ | G01J 5/045 |

FOREIGN PATENT DOCUMENTS

| | | | | | |
|---|---|---|---|---|---|
| JP | 8-35879 | A | | 2/1996 | |
| JP | H09264784 | A | * | 10/1997 | ............. G01J 5/045 |
| JP | 2003-156390 | A | | 5/2003 | |
| JP | 2004-146816 | A | | 5/2004 | |
| JP | 2009206253 | A | * | 9/2009 | ........... H10F 39/804 |
| JP | 2013-143416 | A | | 7/2013 | |
| JP | 2016082060 | A | * | 5/2016 | |
| WO | 2006/095834 | A1 | | 9/2006 | |
| WO | WO-2013139403 | A1 | * | 9/2013 | ............. G02B 1/115 |
| WO | WO-2016024946 | A1 | * | 2/2016 | ............. H01L 23/10 |
| WO | WO-2017122449 | A1 | * | 7/2017 | ............. H04N 23/54 |

OTHER PUBLICATIONS

International Search Report and Written Opinion mailed on Sep. 29, 2020, received for PCT Application PCT/JP2020/026226, filed on Jul. 3, 2020, 9 pages including English Translation.
Notice of Reasons for Refusal mailed on Mar. 30, 2021, received for JP Application 2020-572565, 8 pages including English Translation.

* cited by examiner

INFRARED SENSOR AND METHOD OF MANUFACTURING INFRARED SENSOR

CROSS-REFERENCE TO RELATED APPLICATION

The present application is based on PCT filing PCT/JP2020/026226, filed Jul. 3, 2020, the entire contents of which are incorporated herein by reference.

TECHNICAL FIELD

The present disclosure relates to an infrared sensor and a method of manufacturing an infrared sensor.

BACKGROUND ART

Infrared sensors are classified into the quantum type (cooling type) and the thermal type (non-cooling type). A thermal infrared sensor converts infrared radiation absorbed by an infrared absorber into heat. The thermal infrared sensor converts temperature change caused by the converted heat into an electrical signal. The temperature change by infrared radiation occurs in an infrared detector of the thermal infrared sensor. An insulation structure with which the infrared detector is thermally isolated from the substrate of the thermal infrared sensor increases the temperature change of the infrared detector caused by the infrared detector absorbing the incident infrared radiation. The infrared detector may be held in an internal space in a vacuum in the insulation structure. This suppresses reduction in thermal resistance of the insulation structure due to heat transfer through gas and gas convection in the internal space, thereby further enhancing thermal insulation.

An infrared sensor having an infrared sensor substrate and a signal processing circuit substrate facing each other is also known. An insulation structure is provided between the infrared sensor substrate and the signal processing circuit substrate. The internal space of the insulation structure is hermetically sealed to be thermally insulated. The infrared sensor substrate has a pixel array formed with a plurality of pixels including infrared detection elements. The signal processing circuit substrate has a signal processing circuit for processing an output signal from each infrared detection element. The signal processing circuit is, for example, an analog/digital conversion circuit.

An example of the infrared sensor having the structure as described above is an optical device (infrared sensor) described in WO20061095834 (PTL 1). In the optical device described in the publication above, a photoelectric conversion portion (infrared detection element) faces an aperture (internal space) hermetically sealed. The aperture is hermetically sealed by a first main surface of a substrate (first semiconductor substrate) having the photoelectric conversion portion, the photoelectric conversion portion, a second main surface of a signal processing circuit portion (second semiconductor substrate), a sealing material, and interconnection wiring (first connection).

CITATION LIST

Patent Literature

PTL 1 WO2006/095834

SUMMARY OF INVENTION

Technical Problem

In the optical device described in the publication above, after the substrate and the signal processing circuit portion are electrically connected by the interconnection wiring, the substrate, the signal processing circuit portion, and the connection wiring are hermetically sealed by the sealing material. The aperture is formed by removing the sealing material. Thus, in the optical device described in the publication above, the scaling of the aperture and the electrical connection between the substrate and the signal processing circuit portion are performed separately. This increases the manufacturing cost of the infrared sensor.

The present disclosure is made in view of the problem above and an object of the present disclosure is to provide an infrared sensor and a method of manufacturing an infrared sensor that can suppress increase of the manufacturing cost.

Solution to Problem

An infrared sensor according to the present disclosure includes a first semiconductor substrate, a second semiconductor substrate, a sealing frame, and a first connection. The first semiconductor substrate includes a first main surface and an infrared detection element. The infrared detection element is arranged at the first main surface. The second semiconductor substrate includes a second main surface and a signal processing circuit. The second main surface faces the first main surface. The signal processing circuit processes a signal of the infrared detection element. The sealing frame is connected to the first semiconductor substrate and the second semiconductor substrate. The sealing frame surrounds an internal space with the first main surface, the infrared detection element, and the second main surface. The first connection electrically connects the infrared detection element and the signal processing circuit. The internal space is hermetically sealed by the first main surface, the infrared detection element, the second main surface, and the sealing frame. Each of the sealing frame and the first connection is sandwiched between the first main surface and the second main surface.

Advantageous Effects of Invention

In the infrared sensor according to the present disclosure, increase of the manufacturing cost of the infrared sensor can be suppressed.

BRIEF DESCRIPTION OF DRAWINGS

FIG. 2 is a top view schematically illustrating the configuration of the infrared sensor according to the first embodiment.

FIG. 5 is a top view schematically illustrating the configuration of the infrared sensor according to the modification to the first embodiment.

FIG. 8 is a circuit diagram schematically illustrating the configuration of the infrared sensor according to the first embodiment.

FIG. 12 is a cross-sectional view schematically illustrating a configuration of an infrared sensor according to a third embodiment.

FIG. 14 is a cross-sectional view schematically illustrating a configuration of an infrared sensor according to a fifth embodiment.

DESCRIPTION OF EMBODIMENTS

Embodiments will be described below based on the drawings. In the following, like or corresponding parts are denoted by like reference signs and an overlapping description is not repeated.

First Embodiment

Figure 1:
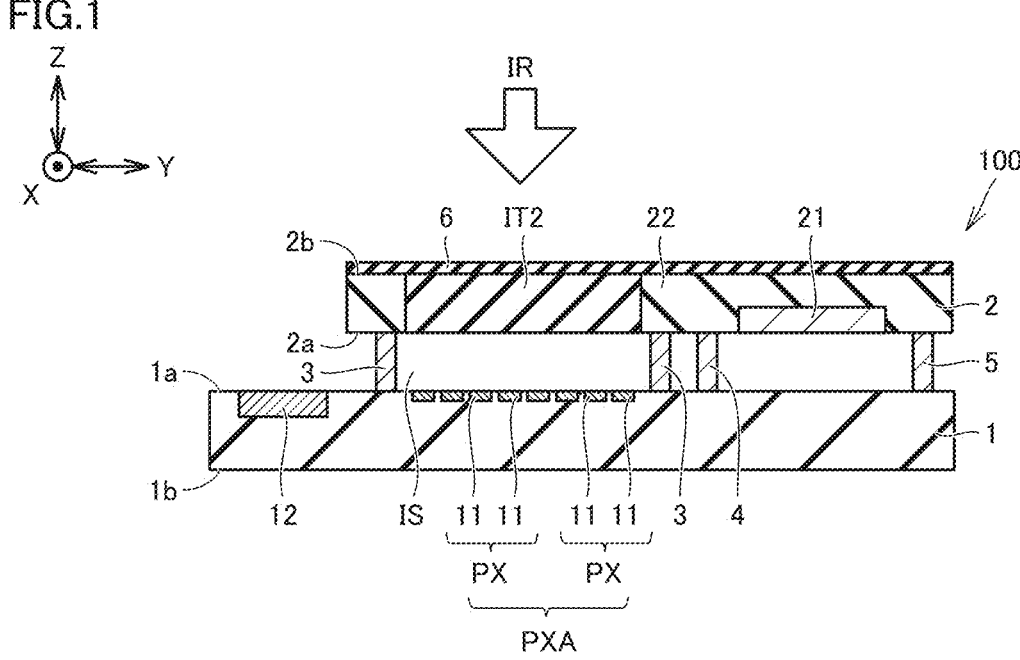
FIG. 1 is a cross-sectional view schematically illustrating a configuration of an infrared sensor according to a first embodiment.
Figure 2:
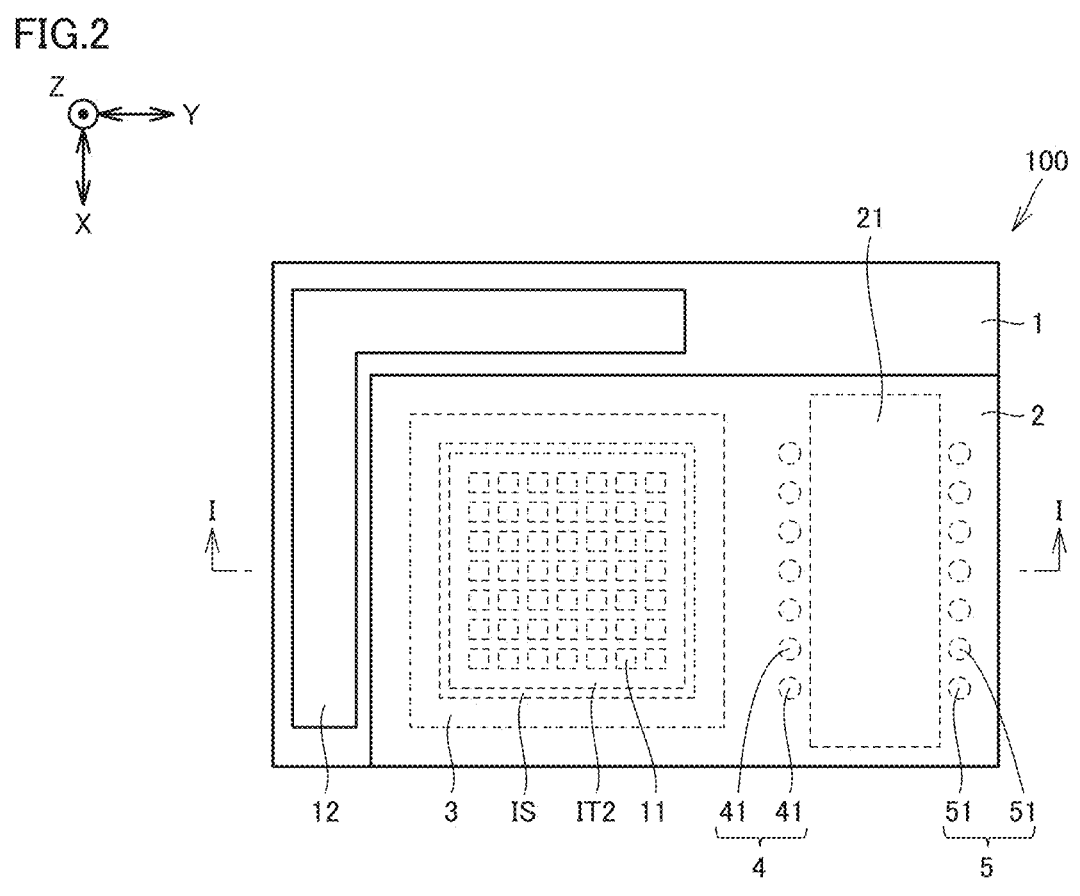

Referring to FIG. 1 and FIG. 2, a configuration of an infrared sensor 100 according to a first embodiment will be described FIG. 1 is a cross-sectional view along line I-I in FIG. 2.

Infrared sensor 100 is an infrared sensor for detecting infrared radiation IR incident on an infrared sensor 100. Infrared sensor 100 according to the present embodiment is a thermal infrared sensor.

As illustrated in FIG. 1, infrared sensor 100 includes a first semiconductor substrate 1, a second semiconductor substrate 2, a sealing frame 3, and a first connection 4. First semiconductor substrate 1 and second semiconductor substrate 2 are put on each other at a distance from each other. Each of sealing frame 3 and first connection 4 is sandwiched between first semiconductor substrate 1 and second semiconductor substrate 2.

In the present embodiment, the Z axis direction is a direction along the direction in which first semiconductor substrate 1 and second semiconductor substrate 2 are put on each other. The Z axis positive direction is a direction from first semiconductor substrate 1 toward second semiconductor substrate 2 along the Z axis direction. The Z axis negative direction is a direction from second semiconductor substrate 2 toward first semiconductor substrate 1 along the Z axis direction. The X axis direction is a direction orthogonal to the Z axis direction and along the direction in which first semiconductor substrate 1 extends. The Y axis direction is a direction orthogonal to each of the X axis direction and the Z axis direction. The in-plane direction of first semiconductor substrate 1 is a direction along the X axis direction and the Y axis direction.

In the present embodiment, infrared radiation 1R is incident on infrared sensor 100 along the Z axis negative direction. Infrared sensor 100 is configured to detect infrared radiation IR incident on infrared sensor 100 along the Z axis negative direction. In the present embodiment, "infrared radiation IR is incident on infrared sensor 100 along a certain direction" means that infrared radiation IR having a main component along the certain direction is incident on infrared sensor 100, Infrared radiation IR therefore may have a component along a direction different from the certain direction.

First semiconductor substrate 1 includes a first main surface 1a, a first back surface 1b, an infrared detection element 11, and a control circuit 12. First semiconductor substrate 1 may include a plurality of infrared detection elements 11. In the present embodiment, first semiconductor substrate 1 includes a plurality of infrared detection elements 11.

First main surface 1a protrudes outside of sealing frame 3 along the in-plane direction (the X axis direction and the Y axis direction) of first semiconductor substrate 1. First main surface 1a has a flat surface. First back surface 1b is opposed to first main surface 1a. First back surface 1b therefore extends along the in-plane direction (the X axis direction and the Y axis direction) of first main surface 1a on the side opposite to second semiconductor substrate 2 with respect to first main surface 1a.

Infrared detection element 11 is arranged on first main surface 1a. Infrared detection element 11 is configured to generate a detection signal when infrared radiation IR is incident on infrared detection element 11. Thus, first semiconductor substrate 1 is formed as an infrared sensor substrate. Infrared detection element 11 is, for example, an element employing MEMS (Micro Electro Mechanical Systems) technology, such as a diode, a resistive bolometer, a ferroelectric thin film, and a thermoelectric element.

In the present embodiment, infrared radiation IR is incident on infrared detection element 11 through second semiconductor substrate 2 along the Z axis negative direction. Infrared detection element 11 is therefore arranged to face second semiconductor substrate 2. Infrared sensor 100 is configured to detect infrared radiation IR incident on infrared detection element 11 through second semiconductor substrate 2. As described later, infrared sensor 100 may be configured to detect infrared radiation IR incident on infrared detection element 11 through first back surface 1b of first semiconductor substrate 1.

In the present embodiment, a pixel PX is formed of two infrared detection elements 11 as a unit, A plurality of pixels PX form a pixel array PXA. Control circuit 12 is configured to control a plurality of infrared detection elements 11. Control circuit 12 is configured to control a plurality of pixels PX. The detailed configuration and operation of pixel PX and control circuit 12 will be described later.

First semiconductor substrate 1 may further include a not-illustrated support leg. The support leg is arranged on first main surface 1a. Infrared detection element 11 may be held in the air above first main surface 1*a* by the support leg. That is, infrared detection element 11 may be arranged at a distance from first main surface 1*a* by the support leg.

Second semiconductor substrate 2 extends along the in-plane direction (the X axis direction and the Y axis direction) of first main surface 1*a*. Second semiconductor substrate 2 is arranged at a distance from first semiconductor substrate 1. Second semiconductor substrate 2 faces first semiconductor substrate 1. Second semiconductor substrate 2 faces in parallel to first semiconductor substrate 1. The distance between first semiconductor substrate 1 and second semiconductor substrate 2 along the Z axis direction is the same as the dimension of sealing frame 3 and first connection 4 along the Z axis direction.

Second semiconductor substrate 2 includes a second main surface 2*a*, a second hack surface 2*b*, and a signal processing circuit 21. Second main surface 2*a* faces first main surface 1*a*. Second main surface 2*a* faces first main surface 1*a* at a distance from first main surface 1*a*. Second main surface 2*a* protrudes outside of sealing frame 3 along the in-plane direction (the X axis direction and the Y axis direction) of first main surface 1*a*. Second back surface 2*b* is opposed to second main surface 2*a*. Second back surface 2*b* therefore extends along the in-plane direction (the X axis direction and the Y axis direction) of second main surface 2*a* on the side opposite to first semiconductor substrate 1 with respect to second main surface 2*a*.

Signal processing circuit 21 is configured to process a signal of infrared detection element 11. Specifically, signal processing circuit 21 is configured to process a detection signal transmitted from infrared detection element 11. In the present embodiment, signal processing circuit 21 is configured to process a detection signal transmitted from each of a plurality of infrared detection elements 11. Thus, second semiconductor substrate 2 is formed as a signal processing circuit substrate.

Signal processing circuit 21 includes, for example, a read circuit, an amplifier, a sample hold circuit, an analog/digital converter, and a digital signal processing circuit. The read circuit is configured to read an output signal transmitted from each of infrared detection elements 11. The amplifier is configured to amplify a signal transmitted from each of infrared detection elements 11. The detailed configuration and operation of signal processing circuit 21 will be described later.

In the present embodiment, second semiconductor substrate 2 includes a second substrate portion 22 and a second infrared transmitting portion IT2. Second substrate portion 22 and second infrared transmitting portion IT2 are configured to transmit infrared radiation IR. Second infrared transmitting portion IT2 is configured to transmit infrared radiation IR more than second substrate portion 22. Second infrared transmitting portion IT2 faces infrared detection element 11.

Second infrared transmitting portion IT2 contains, for example, an impurity such as phosphorous (F) or boron (B). Thus, second infrared transmitting portion IT2 has a resistivity of, for example, 1 Ω·cm or more. The absorption of infrared radiation IR by second infrared transmitting portion IT2 has a correlation with the resistivity of second infrared transmitting portion 1T2. Therefore, the larger the resistivity of second infrared transmitting portion IT2 is, the less infrared radiation IR is absorbed in second infrared transmitting portion IT2. Accordingly, when the resistivity of second infrared transmitting portion IT2 is, for example, 1

Ω·cm or more, absorption of the infrared radiation IR wavelength by second semiconductor substrate 2 is suppressed.

As illustrated in FIG. 1 and FIG. 2, sealing frame 3 is connected to first semiconductor substrate 1 and to second semiconductor substrate 2. Sealing frame 3 surrounds an internal space IS with first main surface 1*a*, infrared detection element 11, and second main surface 2*a*. Internal space IS is hermetically sealed by first main surface 1*a*, infrared detection element 11, second main surface 2*a*, and sealing frame 3. As illustrated in FIG. 1, internal space IS is sandwiched between first main surface 1*a* and infrared detection element 11, and second main surface 2*a* along the Z axis direction. Each of infrared detection element 11 and second infrared transmitting portion IT2 faces internal space IS. First connection 4, control circuit 12, and signal processing circuit 21 are arranged in a region outside internal space IS. As illustrated in FIG. 2, internal space IS is surrounded by sealing frame 3 around the Z axis.

Gas is unable to move between internal space IS and the region outside internal space IS. Accordingly, internal space IS is thermally insulated. In the present embodiment, internal space IS is sealed in a vacuum state. In the present embodiment, internal space IS is not necessarily sealed in a complete vacuum state.

As illustrated in FIG. 1, sealing frame 3 is sandwiched between first semiconductor substrate 1 and second semiconductor substrate 2 along the direction (Z axis direction) in which first semiconductor substrate 1 and second semiconductor substrate 2 are put on each other. A first end in the Z axis direction of sealing frame 3 is in contact with first main surface 1*a*. A second end in the Z axis direction of sealing frame 3 is in contact with second main surface 2*a*. Sealing frame 3 supports first semiconductor substrate 1 and second semiconductor substrate 2 along the Z axis direction. Sealing frame 3 therefore mechanically connects first semiconductor substrate 1 and second semiconductor substrate 2. Sealing frame 3 does not electrically connect first semiconductor substrate 1 and second semiconductor substrate 2.

The material of sealing frame 3 has electrical conductivity. The material of sealing frame 3 is, for example, metal. The shape of sealing frame 3 is annular. Sealing frame 3 has, for example, a hollow prism shape. The shape and dimensions of sealing frame 3 may be determined as appropriate as long as infrared detection element 11 is surrounded. Sealing frame 3 may further surround, for example, control circuit 12.

First connection 4 electrically connects first semiconductor substrate 1 and second semiconductor substrate 2. Specifically, first connection 4 electrically connects infrared detection element 11 and signal processing circuit 21. The material of first connection 4 has electrical conductivity. First connection 4 is formed as, for example, a bump.

First connection 4 is sandwiched between first semiconductor substrate 1 and second semiconductor substrate 2 along the direction (Z axis direction) in which first semiconductor substrate 1 and second semiconductor substrate 2 are put on each other. A first end in the Z axis direction of first connection 4 is in contact with first main surface 1*a*. A second end in the Z axis direction of first connection 4 is in contact with second main surface 2*a*. First connection 4 therefore supports first semiconductor substrate 1 and second semiconductor substrate 2 along the Z axis direction. First connection 4 mechanically connects first semiconductor substrate 1 and second semiconductor substrate 2.

Each of sealing frame 3 and first connection 4 is sandwiched between first main surface 1*a* and second main surface 2a. Each of sealing frame 3 and first connection 4 has the same dimension along the direction (Z axis direction) in which first semiconductor substrate 1 and second semiconductor substrate 2 are put on each other.

In the present embodiment, the material of first connection 4 is the same as the material of sealing frame 3. The melting point of first connection 4 is therefore the same as the melting point of sealing frame 3.

Infrared sensor 100 further includes a second connection 5. Second connection 5 is sandwiched between first main surface 1a and second main surface 2a. A first end in the Z axis direction of second connection 5 is in contact with first main surface 1a. A second end in the Z axis direction of second connection 5 is in contact with second main surface 2a. Second connection 5 therefore supports first semiconductor substrate 1 and second semiconductor substrate 2 along the Z axis direction. Second connection 5 mechanically connects first semiconductor substrate 1 and second semiconductor substrate 2. Second connection 5 does not electrically connect first semiconductor substrate 1 and second semiconductor substrate 2. Second connection 5 is formed as a dummy bump.

In the present embodiment, second connection 5 has a higher melting point than first connection 4 and sealing frame 3. For example, when the material of first connection 4 and sealing frame 3 is indium (In) or indium alloy, the material of second connection 5 is nickel (Ni) or copper (Cu).

Infrared sensor 100 further includes an antireflective film 6. In the present embodiment, antireflective film 6 is arranged on the side opposite to first semiconductor substrate 1 with respect to second main surface 2a. Antireflective film 6 covers second back surface 2b. Antireflective film 6 overlaps infrared detection element 11 along the Z axis direction. Infrared radiation IR is therefore incident on infrared detection element 11 through antireflective film 6.

Antireflective film 6 is formed to prevent reflection of infrared radiation IR. In the present embodiment, antireflective film 6 does not need to completely prevent reflection of infrared radiation IR. Antireflective film 6 may be formed to suppress reflection of infrared radiation IR incident on antireflective film 6.

Antireflective film 6 is, for example, an antireflection coat (AR coat) such as diamond like carbon (DLC) or zinc sulfide (ZnS).

As illustrated in FIG. 2, first connection 4 includes a plurality of first connection portions 41. Each of first connection portions 41 electrically connects first semiconductor substrate 1 and second semiconductor substrate 2. Each of first connection portions 41 has, for example, a cylindrical shape. Each of first connection portions 41 may have the same diameter.

Second connection 5 includes a plurality of second connection portions 51. Each of second connection portions 51 does not electrically connect first semiconductor substrate 1 and second semiconductor substrate 2. Each of second connection portions 51 has, for example, a cylindrical shape. Each of second connection portions 51 may have the same diameter.

Second infrared transmitting portion IT2 overlaps infrared detection element 11 along the direction (Z axis direction) in which first semiconductor substrate 1 and second semiconductor substrate 2 are put on each other. Control circuit 12 and signal processing circuit 21 do not overlap infrared detection element 11 along the direction (Z axis direction) in which first semiconductor substrate 1 and second semiconductor substrate 2 are put on each other.

Signal processing circuit 21 is sandwiched between first connection 4 and second connection 5 along the Y axis direction.

Figure 3:
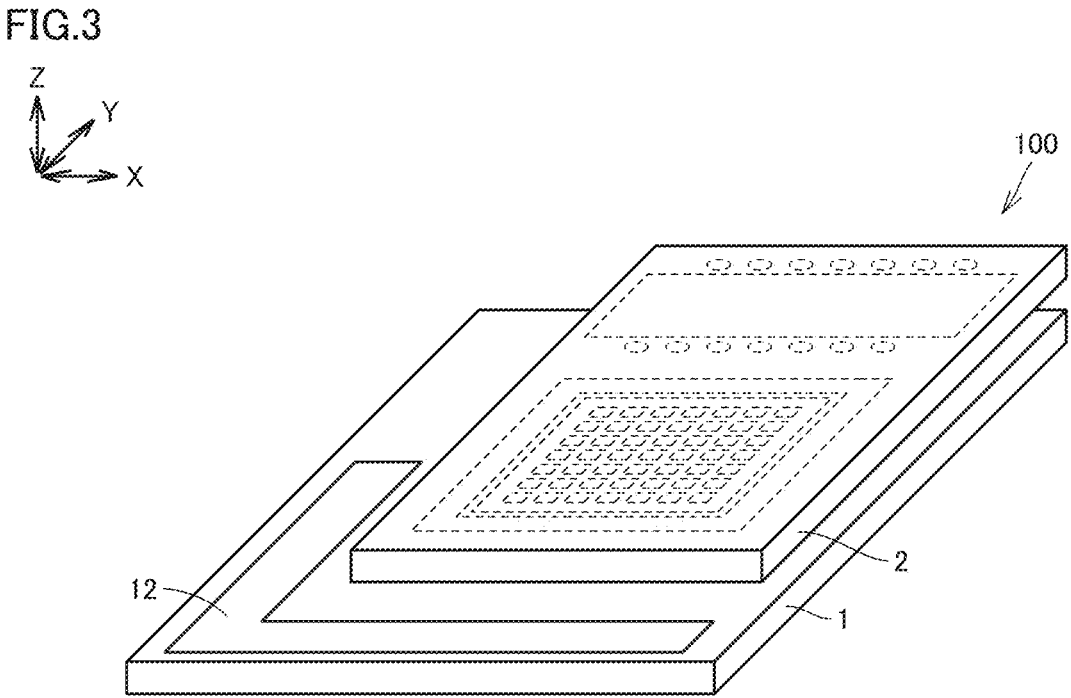
FIG. 3 is a perspective view schematically illustrating the configuration of the infrared sensor according to the first embodiment.

As illustrated in FIG. 2 and FIG. 3, the dimensions in the in-plane direction (the X axis direction and the Y axis direction) of first semiconductor substrate 1 may be larger than the dimensions in the in-plane direction (the X axis direction and the Y axis direction) of second semiconductor substrate 2. In the present embodiment, control circuit 12 is arranged to overlap second semiconductor substrate 2 in the Z axis direction. Control circuit 12 may be arranged so as not to overlap second semiconductor substrate 2 in the Z axis direction. In FIG. 3, for convenience of explanation, infrared sensor 100 is illustrated in a simplified form as appropriate.

Figure 4:
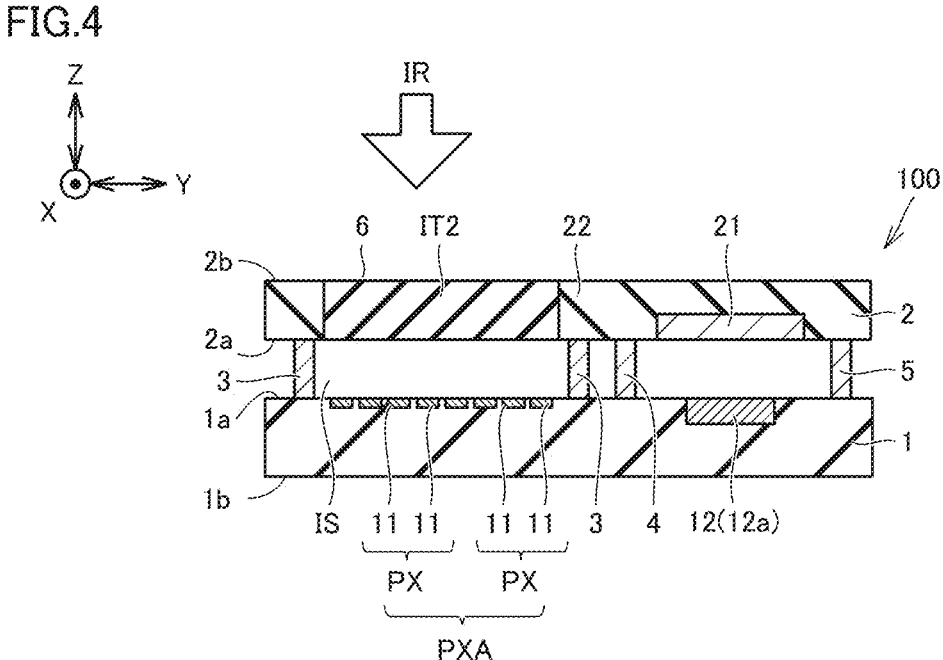
FIG. 4 is a cross-sectional view schematically illustrating a configuration of the infrared sensor according to a modification to the first embodiment.
Figure 5:
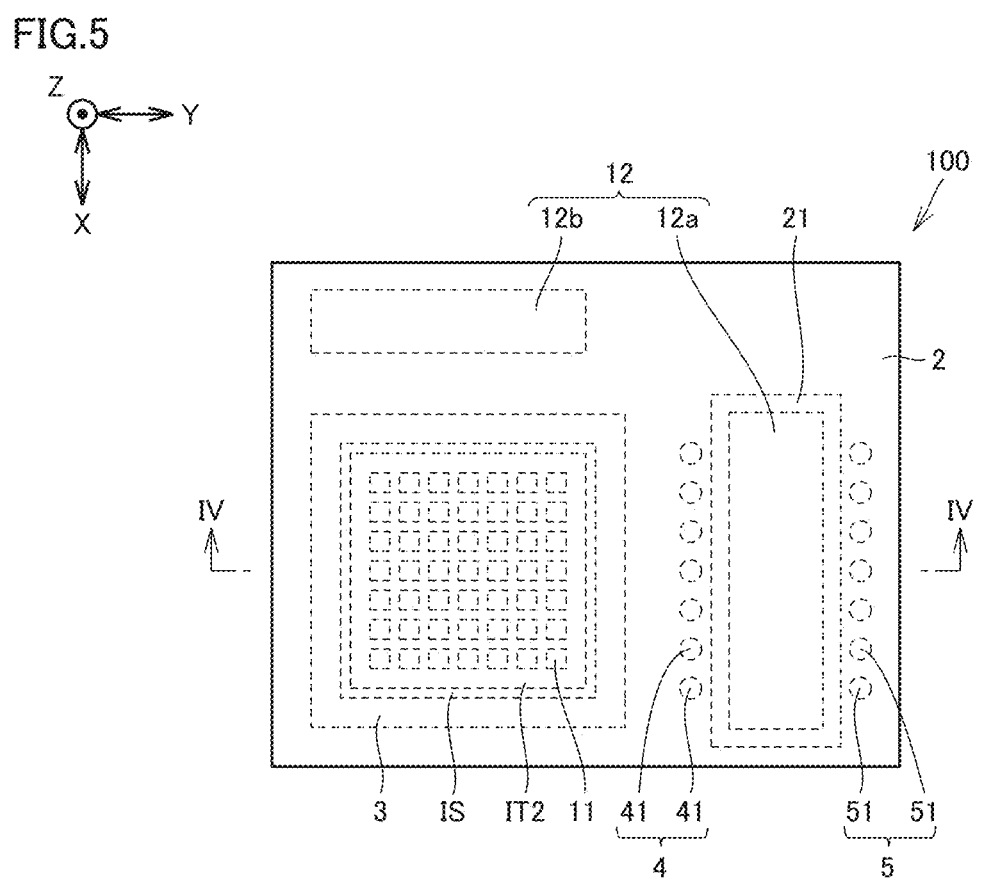
Figure 6:
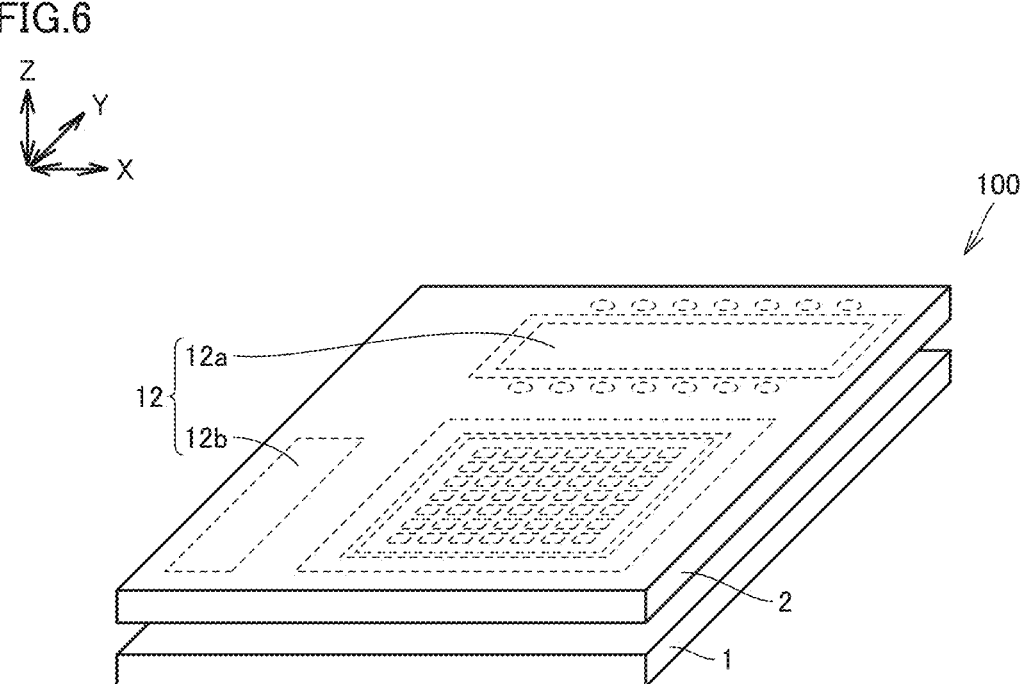
FIG. 6 is a perspective view schematically illustrating the configuration of the infrared sensor according to the modification to the first embodiment.

Referring now to FIG. 4 to FIG. 6, a configuration of infrared sensor 100 according to a modification to the first embodiment will be described. FIG. 4 is a cross-sectional view along line 1V-IV in FIG. 5.

As illustrated in FIG. 4, control circuit 12 according to the modification to the first embodiment faces second main surface 2a. Specifically, control circuit 12 faces signal processing circuit 21. Control circuit 12 overlaps signal processing circuit 21 along the Z axis direction.

As illustrated in FIG. 5, control circuit 12 includes a first control circuit portion 12a and a second control circuit portion 12b. First control circuit portion 12a and second control circuit portion 12b are electrically connected by not-illustrated wiring. First control circuit portion 12a and signal processing circuit 21 are sandwiched between first connection 4 and second connection 5 along the Y axis direction. As illustrated in FIG. 5 and FIG. 4, first control circuit portion 12a faces signal processing circuit 21.

As illustrated in FIG. 5 and FIG. 6, the dimension along each of the X axis direction and the Y axis direction of first semiconductor substrate 1 may be the same as the dimension along each of the X axis direction and the Y axis direction of second semiconductor substrate 2. In FIG. 6, for convenience of explanation, infrared sensor 100 is illustrated in a simplified form as appropriate.

Figure 7:
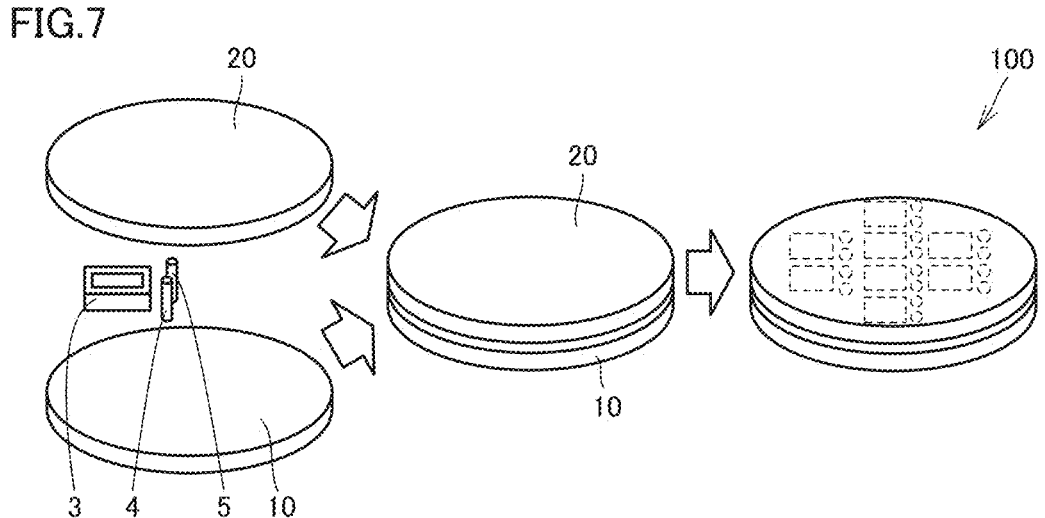
FIG. 7 is a perspective view schematically illustrating another method of manufacturing the infrared sensor according to the first embodiment.

Referring now to FIG. 1 and FIG. 7, a method of manufacturing infrared sensor 100 according to the first embodiment will be described.

The method of manufacturing infrared sensor 100 includes step S101 of preparing and step S102 of electrically connecting.

As illustrated in FIG. 1, first semiconductor substrate 1, second semiconductor substrate 2, sealing frame 3, and first connection 4 are prepared. In the present embodiment, second connection 5 is further prepared.

Specifically, first semiconductor substrate 1 and second semiconductor substrate 2 are prepared specifically in accordance with the following process. First, a wafer process is used for a silicon (S1) substrate serving as first semiconductor substrate 1 to form pixel array PXA (see FIG. 1) and control circuit 12.

Subsequently, a metallized pattern is formed in each of a region in which sealing frame 3 is arranged in the silicon substrate serving as first semiconductor substrate 1 and a region in which sealing frame 3 is arranged in the silicon substrate serving as second semiconductor substrate 2. The region in which sealing frame 3 is arranged is located outside the pixel array.

Specifically, for example, titanium (Ti) or chromium (Cr) and copper (Cu) are successively deposited by sputtering on the entire first main surface 1a of first semiconductor substrate 1. Subsequently, a resist pattern is formed by photolithography (lithography technology). Then, nickel (Ni) and gold (Au) are successively formed by electroplating on first main surface 1a. Subsequently, the resist pattern is removed. The underlying film is removed. The metallized pattern is thus formed on first semiconductor substrate 1.

In second semiconductor substrate 2, the metallized pattern is formed in the same manner as in first semiconductor substrate 1. Second semiconductor substrate 2 may be produced separately from first semiconductor substrate 1. Second semiconductor substrate 2 thus may be produced by a conventional common silicon wafer process.

Then, silicon etching or the like is performed by micromachining technology on each of the silicon substrate serving as first semiconductor substrate 1 and the silicon substrate serving as second semiconductor substrate 2, First semiconductor substrate 1 and second semiconductor substrate 2 are thus produced.

Then, each of sealing frame 3 and first connection 4 is sandwiched between first main surface 1a, infrared detection element 11, and second main surface 2a, whereby internal space IS is surrounded by first main surface 1a, infrared detection element 11, second main surface 2a, and sealing frame 3, and internal space IS is hermetically sealed. Second connection 5 is sandwiched together with sealing frame 3 and first connection 4 between first main surface 1a and second main surface 2a.

Specifically, the first end of sealing frame 3 is bonded to first main surface 1a. The first end of first connection 4 is bonded to first main surface 1a. The second end of sealing frame 3 is bonded to second main surface 2a. The second end of first connection 4 is bonded to second main surface 2a. Thus, internal space IS is sealed. First semiconductor substrate 1 and second semiconductor substrate 2 are connected to each other with sealing frame 3, first connection 4, and second connection 5 interposed. First semiconductor substrate 1 and second semiconductor substrate 2 are arranged at a distance from each other by the dimension along the Z axis direction of sealing frame 3, first connection 4, and second connection 5.

In the present embodiment, internal space IS is hermetically sealed by first main surface 1a, infrared detection element 11, second main surface 2a, and sealing frame 3 in a vacuum atmosphere, Specifically, first main surface 1a and second main surface 2a are bonded to sealing frame 3 in a vacuum atmosphere with the temperature of first semiconductor substrate 1 and second semiconductor substrate 2 kept at a temperature equal to or higher than the melting point of the material of sealing frame 3.

Each of sealing frame 3 and first connection 4 is sandwiched between first main surface 1a, infrared detection element 11, and second main surface 2a, whereby infrared detection element 11 and signal processing circuit 21 are electrically connected by first connection 4, Specifically, the first end of first connection 4 is electrically connected to infrared detection element 11 or not-illustrated wiring connected to infrared detection element 11. The second end of first connection 4 is electrically connected to signal processing circuit 21 or not-illustrated wiring connected to signal processing circuit 21.

As illustrated in FIG. 7, in manufacturing, a first wafer 10 serving as first semiconductor substrate 1 (see FIG. 1) and a second wafer 20 serving as second semiconductor substrate 2 (see FIG. 1) may be used. The process may be performed in a wafer state to produce first semiconductor substrate 1. (see FIG. 1) and second semiconductor substrate 2 (see FIG. 1). In FIG. 7, one scaling frame 3, one first connection 4, and one second connection 5 are illustrated, but a plurality of sealing frames 3, first connections 4, and second connections 5 are prepared.

As described above, the sealing of internal space IS and the electrical connection between infrared detection element 11 and signal processing circuit 21 are performed simultaneously.

Referring to FIG. 1, the operation principle and sensitivity of infrared sensor 100 according to the first embodiment will now be described.

Infrared sensor 100 is configured to convert infrared radiation IR absorbed by infrared sensor 100 into heat. Specifically, infrared detection element 11 is configured to convert infrared radiation IR absorbed by infrared detection element 11 into heat. Infrared sensor 100 is configured to convert temperature change caused by the converted heat into an electrical signal. Infrared sensor 100 is therefore configured to detect infrared radiation IR based on the temperature change of infrared detection element 11.

Thus, the temperature change of infrared detection element 11 due to temperature change of internal space IS is suppressed, thereby improving the sensitivity of infrared sensor 100.

Specifically, as illustrated in FIG. 1, since infrared detection element 11 faces internal space IS, the temperature of infrared detection element 11 changes when the temperature of internal space IS changes. The temperature of internal space IS changes, for example, with the convection of gas filled in internal space IS and heat transfer.

When internal space IS is sealed in a vacuum state, the gas convection and heat transfer is suppressed. Thus, the temperature change of infrared detection element 11 due to the temperature change of internal space IS is suppressed. Infrared sensor 100 according to the present embodiment therefore has high sensitivity.

Figure 8:
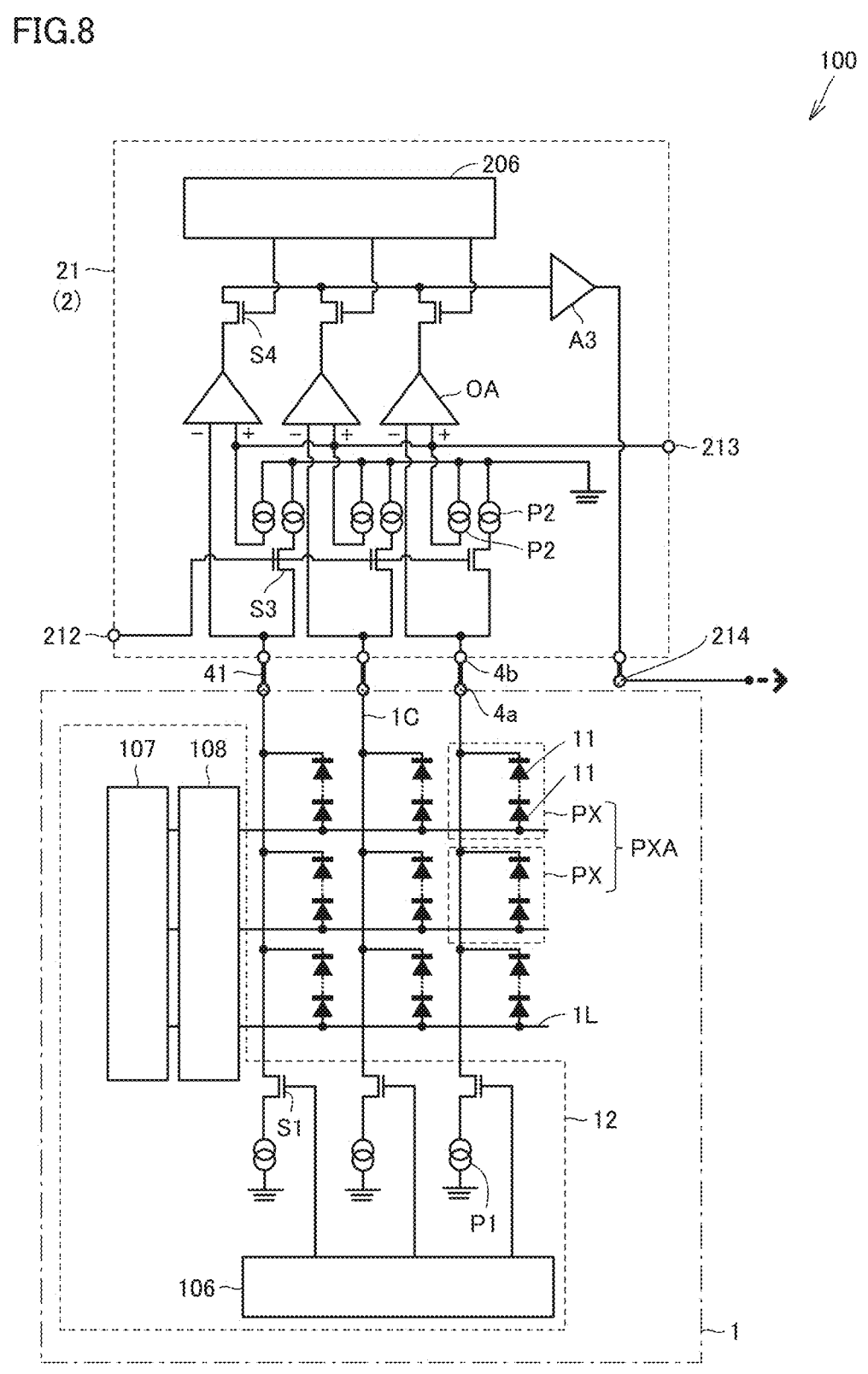
Figure 9:
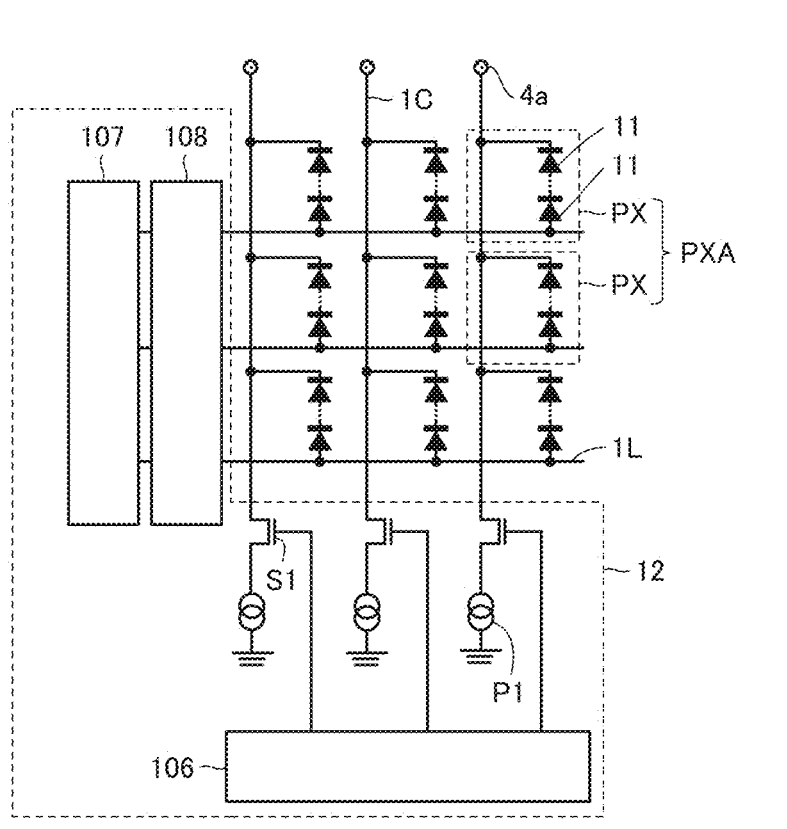
FIG. 9 is a circuit diagram schematically illustrating a configuration of a first semiconductor substrate according to the first embodiment.
Figure 10:
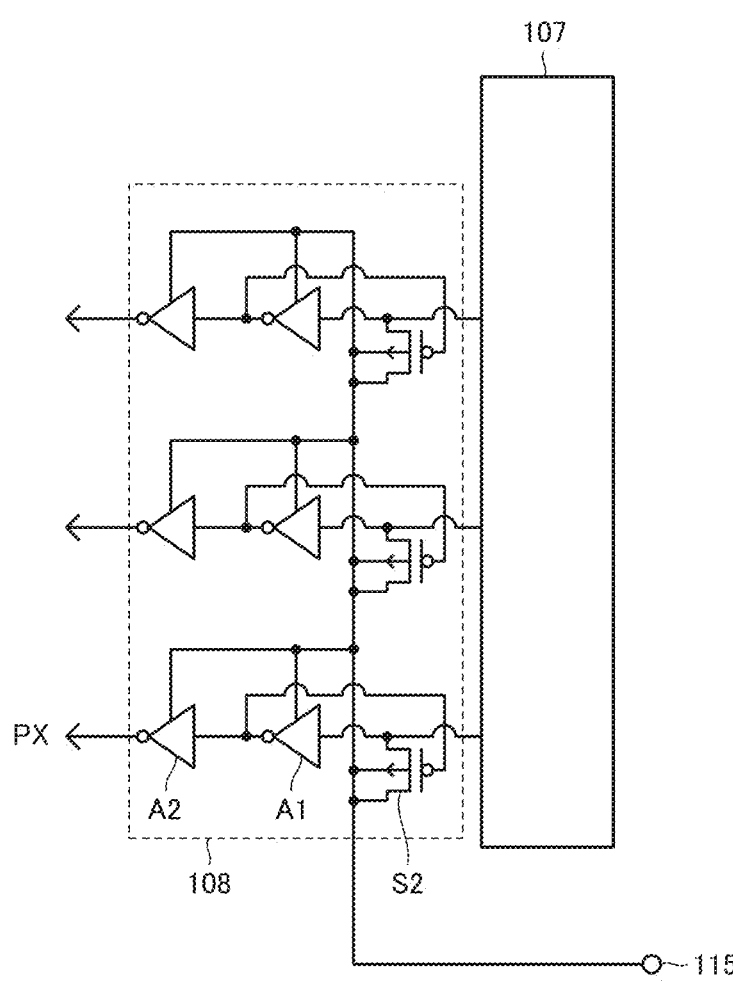
FIG. 10 is a circuit diagram schematically illustrating a configuration of a voltage regulation circuit of the first semiconductor substrate according to the first embodiment.

Referring now to FIG. 8 to FIG. 10, a circuit configuration of infrared sensor 100 according to the first embodiment will be described.

As illustrated in FIG. 8 and FIG. 9, first semiconductor substrate 1 includes a plurality of column signal lines 1C, a plurality of row signal lines 1L, and a plurality of pixels PX. Each of column signal lines 1C extends along the Y axis direction (see FIG. 1). One end of each of column signal lines 1C is connected to a corresponding one of a plurality of output terminals 4a. Each of output terminals 4a is connected to second semiconductor substrate 2 by a corresponding one of first connection portions 41.

Each of row signal lines 1L extends along the X axis direction (see FIG. 1).

A plurality of pixels PX are arranged in a two-dimensional array along the Y axis direction (see FIG. 1) and the X axis direction (see FIG. 2). Pixel array PXA is thus formed. Each of pixels PX includes two infrared detection elements 11 connected to each other. One of two infrared detection elements 11 is connected to one column signal line 1C among a plurality of column signal lines 1C. The other of two infrared detection elements 11 is connected to one row signal line 1L among a plurality of row signal lines 1L.

Control circuit 12 includes a plurality of first switching elements S1, a plurality of first current sources P1, a first column select circuit 106, a row select circuit 107, and a voltage regulation circuit 108. Each of first switching elements S1 is connected to a corresponding one of column signal lines 1C.

Each of first current sources P1 is connected to a corresponding one of column signal lines 1C. Each of first current sources P1 is connected to column signal line 1C through first switching element S1. Each of first current sources P1 is connected to a plurality of pixels PX through column signal line 1C.

First column select circuit 106 is configured to selectively connect each of first current sources P1 to infrared detection element 11 through the corresponding column signal line 1C. First column select circuit 106 is configured to selectively connect each of first current sources P1 to the corresponding infrared detection element 1 through first switching element S1.

Row select circuit 107 is configured to selectively apply a voltage to a plurality of infrared detection elements 11 through a plurality of row signal lines 1L, Voltage regulation circuit 108 is configured to apply a variable voltage to two infrared detection elements 11 of each of pixels PX through a plurality of row signal lines 1L. Row select circuit 107 and voltage regulation circuit 108 are configured as a first voltage source.

FIG. 10 is a circuit diagram illustrating the configuration of voltage regulation circuit 108 in detail. In FIG. 8 and FIG. 9, voltage regulation circuit 108 is on the right side of row select circuit 107 in the drawing sheet, whereas in FIG. 10, voltage regulation circuit 108 is on the left side of row select circuit 107 in the drawing sheet.

As illustrated in FIG. 10, voltage regulation circuit 108 includes a plurality of second switching elements S2, a plurality of first amplifiers A1, and a plurality of second amplifiers A2. Each of second switching elements S2, each of first amplifiers A1, and each of second amplifiers A2 are connected to a corresponding one of row signal lines 1L. A plurality of second switching elements S2, first amplifiers A1, and a plurality of second amplifiers A2 are configured as a buffer circuit. An output voltage of the buffer circuit changes with a voltage value input from the power supply of the pixels.

As described above, first semiconductor substrate 1 has at least a means for enabling voltage to be applied to pixel array PXA and current to flow through pixel array PXA. That is, as illustrated in FIG. 8, first semiconductor substrate 1 has first current sources P1, first column select circuit 106, row select circuit 107, and voltage regulation circuit 108 as the means for applying voltage and feeding current to pixel array PXA. A plurality of pixels PX arranged in a two-dimensional array can be selected one by one by first column select circuit 106 and row select circuit 107. A variable voltage can be applied to two infrared detection elements 11 of each of pixels PX by row select circuit 107 and voltage regulation circuit 108.

As illustrated in FIG. 8, second semiconductor substrate 2 includes a plurality of input terminals 4b, a plurality of third switching elements S3, a plurality of fourth switching elements S4, a plurality of second current sources P2, a plurality of operation amplifiers OA, a second column select circuit 206, and a third amplifier A3.

Each of input terminals 4b of signal processing circuit 21 is connected to a corresponding one of output terminals 4a of first semiconductor substrate 1 by first connection portion 41. Each of third switching elements S3, each of fourth switching elements S4, each of second current sources P2, and each of operation amplifiers OA are connected to a corresponding one of input terminals 4b. Each of input terminals 4b is connected to the inverting input terminal of operation amplifier OA. Each of input terminals 4b is connected to the non-inverting input terminal of operation amplifier OA by third switching element S3 and second current source P2. A plurality of second current sources P2 are connected to two infrared detection elements 11 of each of pixels PX by a plurality of input terminals 4b, a plurality of first connection portions 41, a plurality of output terminals 4a, and a plurality of column signal lines 1C.

A bias voltage is applied to the non-inverting input terminal of operation amplifier OA through a first external terminal 213. Third switching elements S3 connect or disconnect a plurality of input terminals 4b and a plurality of second power supplies in accordance with a control voltage input through a second external terminal 212. Third switching elements S3 are connected (turned on) when infrared sensor 100 operates and captures an image. Third external terminal 214 is connected to the outside.

A plurality of operation amplifiers OA are configured to operate as integral circuits, Second column select circuit 206 is configured to selectively send output signals from a plurality of operation amplifiers OA to third amplifier A3 by a plurality of fourth switching elements S4. Third amplifier A3 is configured to amplify a signal. Third amplifier A3 is configured to output the amplified signal finally from infrared sensor 100.

When infrared sensor 100 operates and captures an image, a plurality of pixels PX arranged in a two-dimensional array can be selected one by one by second column select circuit 206 of second semiconductor substrate 2 and row select circuit 107 of first semiconductor substrate 1. When infrared sensor 100 operates and captures an image, second current source P2 of second semiconductor substrate 2 is connected to infrared detection element 11. When infrared sensor 100 operates and captures an image, first current source P1 of first semiconductor substrate 1 is not connected to infrared detection element 11. A variable voltage is applied to infrared detection element 11 by row select circuit 107 and voltage regulation circuit 108.

The terminal-to-terminal voltage of second current source P2 connected to infrared detection element 11 and the terminal-to-terminal voltage of second current source P2 connected to input terminal 4b are input to operation amplifier OA. As a result, third amplifier A3 finally outputs a signal in which a voltage drop distribution due to wiring resistance in the horizontal direction is subtracted.

Second semiconductor substrate 2 is configured such that the output signals of a plurality of infrared detection elements 11 that are input from first semiconductor substrate 1 through a plurality of first connection portions 41 are differentially amplified and output by the integral circuits of operation amplifiers OA. Since output signals of a plurality of infrared detection elements 11 are amplified and the output signals are converted into digital data by a not-illustrated analog/digital converter, a satisfactory output signal can be finally output without being influenced by a circuit at a subsequent stage.

Second semiconductor substrate 2 may perform signal processing by a not-illustrated digital signal processing circuit after converting the output signals of a plurality of infrared detection elements 11 into digital data by the not-illustrated analog/digital converter. The digital data has high noise immunity and therefore is suitable for operation processing. The not-illustrated digital signal processing circuit is mounted on second semiconductor substrate 2.

Feedback may be performed with an output signal of the not-illustrated digital signal processing circuit so that even more optimum control can be performed on second semiconductor substrate 2 of infrared sensor 100. An output signal of the not-illustrated digital signal processing circuit may be converted into an analog voltage signal by a not-illustrated digital/analog converter and thereafter sent to first semiconductor substrate 1 through first connection portion 41. The not-illustrated digital/analog converter may be mounted on first semiconductor substrate 1. The not-illustrated digital/analog converter mounted on first semiconductor substrate 1 can transfer a signal kept in the form of a digital signal.

Although the configuration in which each of output terminals 4a connected to a corresponding one of column signal lines 1C of first semiconductor substrate 1 is connected to input terminal 4b of second semiconductor substrate 2 by first connection portion 41 has been described, the circuit configuration of each of first semiconductor substrate 1 and second semiconductor substrate 2 is not limited thereto and can be selected as appropriate depending on the applications. For example, each of output terminals 4a connected to a corresponding one of row signal lines 1L of first semiconductor substrate 1 may be connected to input terminal 4b of second semiconductor substrate 2 by first connection portion 41.

The operation effect of the present embodiment will now be described.

In infrared sensor 100 according to the present embodiment, as illustrated in FIG. 1, each of sealing frame 3 and first connection 4 is sandwiched between first main surface 1a and second main surface 2a. Each of sealing frame 3 and first connection 4 therefore can be sandwiched by first main surface 1a and second main surface 2a. Accordingly, sealing frame 3 and first connection 4 can be sandwiched together by first main surface 1a and second main surface 2a. Therefore, the sealing of internal space IS and the electrical connection between first semiconductor substrate 1 and second semiconductor substrate 2 can be performed simultaneously. Accordingly, increase of the manufacturing cost of infrared sensor 100 can be suppressed.

As illustrated in FIG. 1, infrared sensor 100 further includes antireflective film 6. Antireflective film 6 is formed to prevent reflection of infrared radiation IR. Therefore, occurrence of a stray light component due to reflected light of the incident infrared radiation IR can be suppressed compared with when antireflective film 6 is not provided. The stray light component is a component resulting from unnecessary infrared scattering. Accordingly, reduction of sensitivity of infrared sensor 100 due to the stray light component can be suppressed.

As illustrated in FIG. 1, second semiconductor substrate 2 includes second substrate portion 22 and second infrared transmitting portion 1T2, Second infrared transmitting portion 1T2 is configured to transmit infrared radiation IR more than second substrate portion 22. The strength of infrared radiation IR incident on infrared detection element 11 therefore can be enhanced compared with when infrared radiation IR is incident on infrared detection element 11 through second substrate portion 22. Accordingly, the sensitivity of infrared sensor 100 can be enhanced.

As illustrated in FIG. 1, infrared sensor 100 further includes second connection 5. The load applied to sealing frame 3 and first connection 4 therefore can be distributed compared with when only sealing frame 3 and first connection 4 are sandwiched between first main surface 1a and second main surface 2a. Accordingly, first semiconductor substrate 1 and second semiconductor substrate 2 can be arranged such that first semiconductor substrate 1 and second semiconductor substrate 2 face in parallel to each other even when a load is applied to sealing frame 3 and first connection 4.

As illustrated in FIG. 1, infrared sensor 100 further includes second connection 5. First main surface 1a and second main surface 2a therefore can be connected firmly compared with when only sealing frame 3 and first connection 4 are sandwiched between first main surface 1a and second main surface 2a.

Second connection 5 has a higher melting point than first connection 4. Therefore, the mechanical strength of bonding between first semiconductor substrate 1 and second semiconductor substrate 2 can be enhanced.

More specifically, first semiconductor substrate 1 and second semiconductor substrate 2 are bonded by sealing frame 3, first connection 4, and second connection 5 in accordance with the following steps. First, sealing frame 3, first connection 4, and second connection 5 are arranged between first semiconductor substrate 1 and second semiconductor substrate 2. Sealing frame 3 and first connection 4 are melted by heating at a temperature higher than the melting point of sealing frame 3 and first connection 4 and lower than the melting point of second connection 5. In a state in which first semiconductor substrate 1 and second semiconductor substrate 2 are at a distance from each other by the dimension of second connection 5, first semiconductor substrate 1 and second semiconductor substrate 2 are mechanically and electrically connected by sealing frame 3 and first connection 4. On the other hand, when first connection 4 is melted, second connection 5 is not melted. Therefore, reduction of the strength of second connection 5 due to the melting of second connection 5 can be suppressed. Reduction of the parallelism (the evenness of the distance) between first semiconductor substrate 1 and second semiconductor substrate 2 due to the melting of second connection 5 can be suppressed. The mechanical strength of first semiconductor substrate 1 and second semiconductor substrate 2 therefore can be enhanced. Displacement of second connection 5 due to the melting of second connection 5 can be suppressed. First semiconductor substrate 1 and second semiconductor substrate 2 therefore can be bonded to each other at high accuracy.

The material of sealing frame 3 has electrical conductivity. Sealing frame 3 therefore can be melted at a temperature at which the material of first connection 4 having electrical conductivity can be melted. Accordingly, sealing frame 3 and first connection 4 can be melted at the same temperature. The manufacturing steps therefore can be simplified compared with when sealing frame 3 and first connection 4 are melted at different temperatures.

The material of first connection 4 is the same as the material of sealing frame 3. The melting point of first connection 4 is therefore the same as the melting point of sealing frame 3. Thus, sealing frame 3 and first connection 4 can be melted at the same temperature. Accordingly, the manufacturing steps can be simplified compared with when sealing frame 3 and first connection 4 are melted at different temperatures.

As illustrated in FIG. 1, internal space IS is sealed in a vacuum state. Therefore, occurrence of heat transfer and convection of gas in internal space IS can be suppressed compared with when the pressure of internal space IS is the atmospheric pressure. Accordingly, reduction of thermal resistance of internal space IS can be suppressed. Thus, escape of heat from infrared detection element 11 to internal space IS by heat transfer can be suppressed. The sensitivity of infrared sensor 100 therefore can be enhanced.

As illustrated in FIG. 1, second connection 5 does not electrically connect first semiconductor substrate 1 and second semiconductor substrate 2. Second connection 5 therefore is not in contact with the electrode material of each of first semiconductor substrate 1 and second semiconductor substrate 2. Accordingly, diffusion of second connection 5 to the electrode materials of first semiconductor substrate 1 and second semiconductor substrate 2 can be suppressed.

In infrared sensor 100 according to the modification to the present embodiment, as illustrated in FIG. 4, control circuit 12 faces signal processing circuit 21. Therefore, the dimensions along the in-plane direction (the X axis direction and the Y axis direction) of first semiconductor substrate 1 can be reduced compared with when control circuit 12 does not face signal processing circuit 21. Accordingly, the dimensions along the X axis direction and the Y axis direction of infrared sensor 100 can be reduced.

In the method of manufacturing infrared sensor 100 according to the present embodiment, as illustrated in FIG. 1, each of sealing frame 3 and first connection 4 is sandwiched between first main surface 1*a*, infrared detection element 11, and second main surface 2*a*, whereby internal space IS is surrounded by first main surface 1*a*, infrared detection element 11, second main surface 2*a*, and sealing frame 3, and internal space IS is hermetically sealed. Each of sealing frame 3 and first connection 4 is sandwiched between first main surface 1*a*, infrared detection element 11, and second main surface 2*a*, whereby infrared detection element 11 and signal processing circuit 21 are electrically connected by first connection 4. Therefore, the sealing of internal space IS and the electrical connection between first semiconductor substrate 1 and second semiconductor substrate 2 can be performed at the same time. Thus, the manufacturing steps of infrared sensor 100 can be simplified. Accordingly, increase of the manufacturing cost of infrared sensor 100 can be suppressed.

As illustrated in FIG. 1, internal space IS is hermetically sealed by first main surface 1*a*, infrared detection element 11, second main surface 2*a*, and sealing frame 3 in a vacuum atmosphere. Internal space IS therefore can be sealed in a vacuum state. Accordingly, the sensitivity of infrared sensor 100 can be enhanced.

As illustrated in FIG. 1, second connection 5 is further prepared. Second connection 5 is sandwiched together with sealing frame 3 and first connection 4 between first main surface 1*a* and second main surface 2*a*. The load applied to sealing frame 3 and first connection 4 therefore can be distributed compared with when only sealing frame 3 and first connection 4 are sandwiched between first main surface 1*a* and second main surface 2*a*. Accordingly, first semiconductor substrate 1 and second semiconductor substrate 2 can be arranged such that first semiconductor substrate 1 and second semiconductor substrate 2 face in parallel to each other.

Second Embodiment

Figure 11:
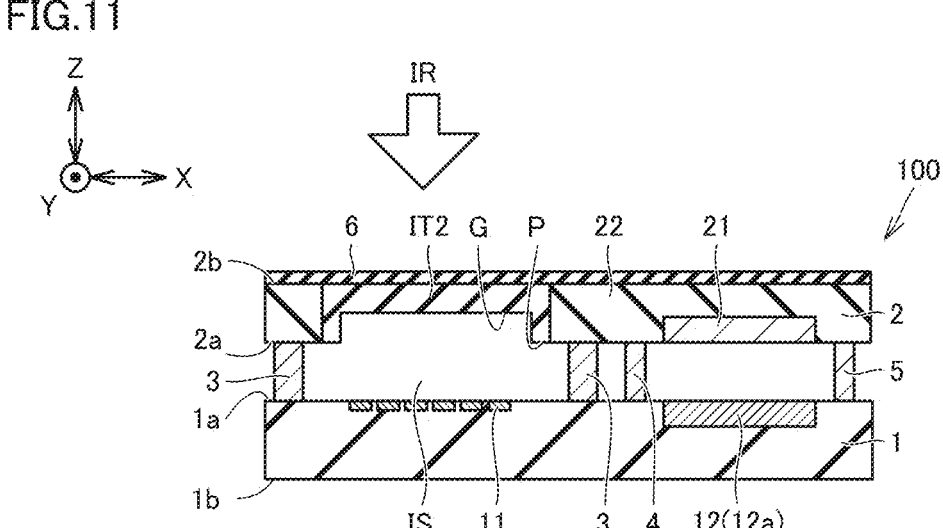
FIG. 11 is a cross-sectional view schematically illustrating a configuration of an infrared sensor according to a second embodiment.

Referring now to FIG. 11, a configuration of infrared sensor 100 according to a second embodiment will be described. The second embodiment has the same configuration, manufacturing method, and operation effects as the modification to the first embodiment described above, unless otherwise specified. The same configuration as the modification to the first embodiment described above is denoted by the same reference sign and will not be further elaborated.

As illustrated in FIG. 11, second main surface 2*a* according to the present embodiment includes a second main surface portion P and a depressed portion G. Second main surface portion P and depressed portion G face internal space IS. Second main surface portion P is a flat surface. Depressed portion G is provided at a position facing infrared detection element 11 to be depressed from second main surface portion P. Specifically, depressed portion G is provided at a position facing infrared detection element 11 to be depressed from second main surface portion P along the direction (Z axis direction) in which first semiconductor substrate 1 and second semiconductor substrate 2 are put on each other. Depressed portion G overlaps infrared detection element 11 along the Z axis direction. In the present embodiment, depressed portion G is provided in second infrared transmitting portion IT2.

The operation effect of the present embodiment will now be described.

In infrared sensor 100 according to the present embodiment, as illustrated in FIG. 11, depressed portion G is provided at a position facing infrared detection element 11 to be depressed from second main surface portion P. The volume of internal space IS is therefore large compared with when second main surface 2*a* is entirely flat. Temperature change of internal space IS can be suppressed with a larger volume of internal space IS. Therefore, the sensitivity of infrared sensor 100 can be enhanced.

Fluctuations of the degree of vacuum due to temperature change of gas escaping from first semiconductor substrate 1, second semiconductor substrate 2, and the like are smaller with a larger volume of internal space IS. Accordingly, even when the escaping gas intrudes into internal space IS, fluctuations of the degree of vacuum due to the escaping gas can be suppressed. The escaping gas is gas released from the members.

As illustrated in FIG. 11, depressed portion G is provided at a position facing infrared detection element 11 to be depressed from second main surface portion P. Therefore, the thickness of second semiconductor substrate 2 at depressed portion U is smaller than the thickness of second semiconductor substrate 2 in a region in which depressed portion G is not provided. That is, second semiconductor substrate 2 is thinned at depressed portion G. Accordingly, second semiconductor substrate 2 has a high transmittivity at depressed portion G. Thus, the strength of infrared radiation IR incident on infrared detection element 11 can be enhanced. Therefore, the sensitivity of infrared sensor 100 can be enhanced.

Third Embodiment

Figure 12:
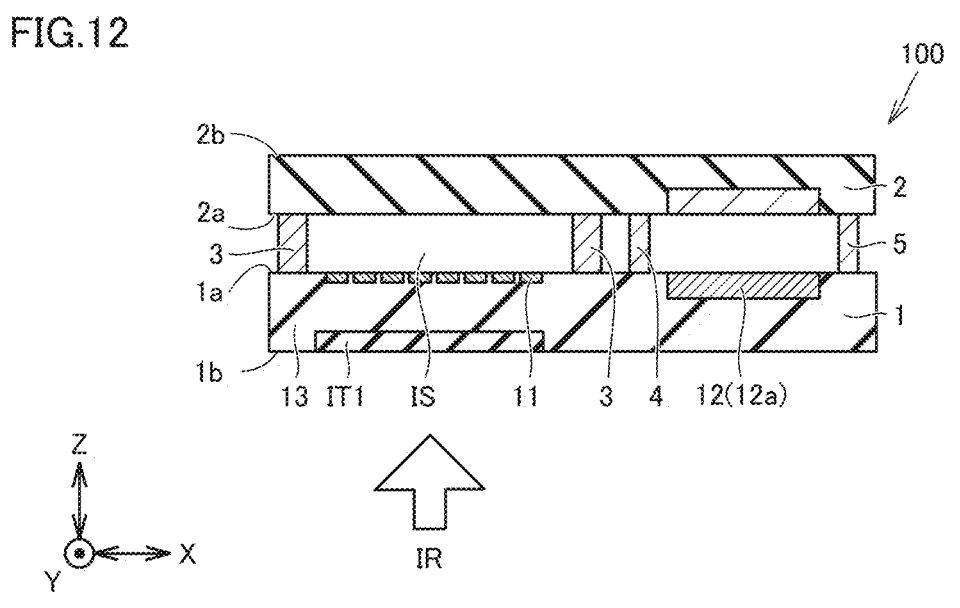

Referring now to FIG. 12, a configuration of infrared sensor 100 according to a third embodiment will be described. The third embodiment has the same configuration, manufacturing method, and operation effects as the modification to the first embodiment described above, unless otherwise specified. The same configuration as the modification to the first embodiment described above is denoted by the same reference sign and will not be further elaborated.

In the present embodiment, infrared radiation IR is incident on infrared detection element 11 through first back surface 1*b* along the Z axis positive direction. Infrared detection element 11 is configured to detect infrared radiation IR incident on infrared detection element 11 through first back surface 1*b* along the Z axis direction.

As illustrated in FIG. 12, first semiconductor substrate 1 according to the present embodiment includes a first substrate portion 13 and a first infrared transmitting portion IT1. First substrate portion 13 and the infrared transmitting portion are configured to transmit infrared radiation IR. First infrared transmitting portion IT1 is configured to transmit infrared radiation IR more than first substrate portion 13. First infrared transmitting portion IT1 faces infrared detection element 11. First infrared transmitting portion IT1 is arranged to overlap infrared detection element 11 in the Z axis direction.

First infrared transmitting portion IT1 contains, for example, an impurity such as phosphorous (P) or boron (B). Thus, first infrared transmitting portion IT1 has a resistivity of, for example, 1 Ω·cm or more.

The absorption of infrared radiation IR by first infrared transmitting portion IT1 has a correlation with the resistivity of first infrared transmitting portion IT1. Therefore, the larger the resistivity of first infrared transmitting portion IT1 is, the less infrared radiation IR is absorbed in first infrared transmitting portion IT1. Accordingly, when the resistivity of first infrared transmitting portion IT1 is, for example, 1 Ω·cm or more, absorption of the infrared radiation IR wavelength by first semiconductor substrate 1 is suppressed. The configuration of first infrared transmitting portion IT1 may be the same as the configuration of second infrared transmitting portion IT2 except for the position where first infrared transmitting portion IT1 is arranged.

The operation effect of the present embodiment will now be described.

In infrared sensor 100 according to the present embodiment, as illustrated an FIG. 12, first semiconductor substrate 1 includes first substrate portion 13 and first infrared transmitting portion IT1. First infrared transmitting portion IT1 is configured to transmit infrared radiation IR more than first substrate portion 13. The strength of infrared radiation IR incident on infrared detection element 11 therefore can be enhanced compared with when infrared radiation IR is incident on infrared detection element 11 through first substrate portion 13. Accordingly, the sensitivity of infrared sensor 100 can be enhanced.

As illustrated in FIG. 12, first infrared transmitting portion IT1 is arranged to overlap infrared detection element 11 in the Z axis direction. Infrared radiation IR is therefore incident on infrared detection element 11 through first infrared transmitting portion IT1 even when infrared radiation IR is incident on first semiconductor substrate 1 from the first back surface 1*b* side of first semiconductor substrate 1. Therefore, infrared detection element 11 can be detected even when infrared radiation IR is incident on first semiconductor substrate 1 from the first back surface 1*b* side.

Fourth Embodiment

Figure 13:
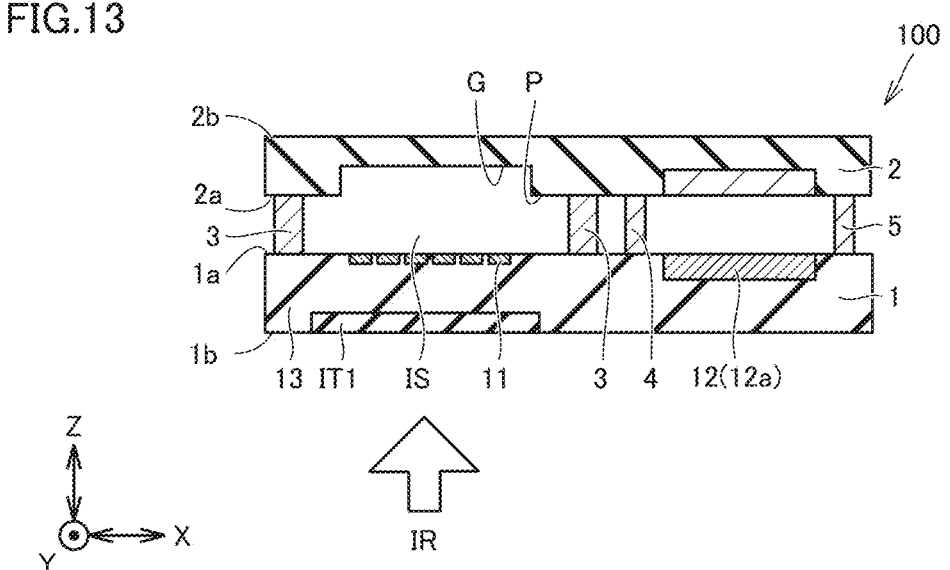
FIG. 13 is a cross-sectional view schematically illustrating a configuration of an infrared sensor according to a fourth embodiment.

Referring now to FIG. 13, a configuration of infrared sensor 100 according to a fourth embodiment will be described. The fourth embodiment has the same configuration, manufacturing method, and operation effects as the third embodiment described above, unless otherwise specified. The same configuration as the third embodiment described above is denoted by the same reference sign and will not be further elaborated.

As illustrated in FIG. 13, second main surface 2*a* according to the present embodiment includes a second main surface portion P and a depressed portion G. Second main surface portion P and depressed portion G face internal space IS. Second main surface portion P is a flat surface. Depressed portion G is provided at a position facing infrared detection element 11 to be depressed from second main surface portion P. Specifically, depressed portion G is provided at a position facing infrared detection element 11 to be depressed from second main surface portion P along the direction (Z axis direction) in which first semiconductor substrate 1 and second semiconductor substrate 2 are put on each other. Depressed portion G overlaps infrared detection element 11 along the Z axis direction. Depressed portion G may at least partially overlap infrared detection element 11 along the Z axis direction.

The operation effect of the present embodiment will now be described.

In infrared sensor 100 according to the present embodiment, as illustrated in FIG. 13, depressed portion G is provided at a position facing infrared detection element 11 to be depressed from second main surface portion P. Therefore, the sensitivity of infrared sensor 100 can be enhanced.

Thus, the sensitivity of infrared sensor 100 can be enhanced even when infrared radiation IR is incident on infrared detection element 11 through first back surface 1*b*.

Fifth Embodiment

Figure 14:
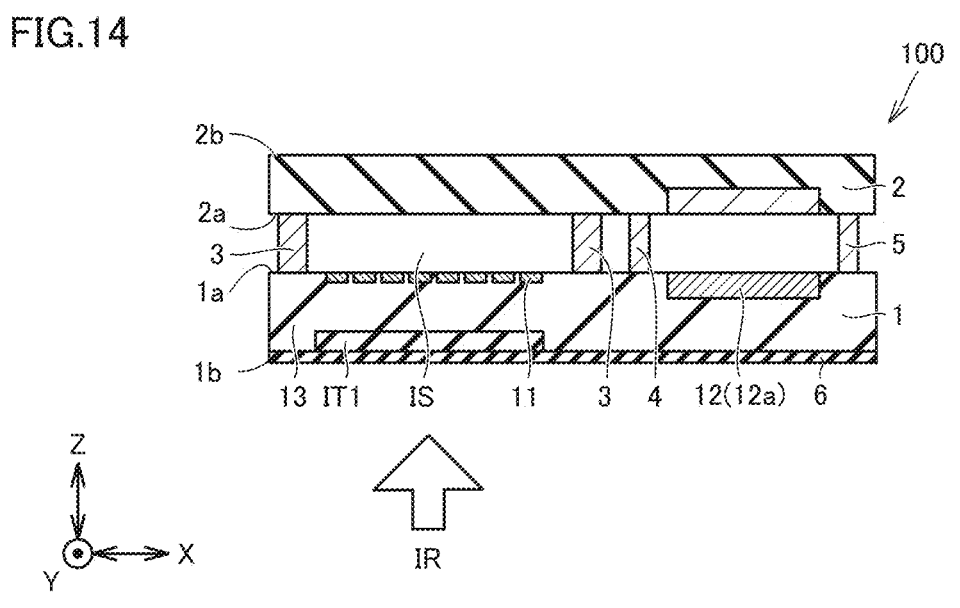

Referring now to FIG. 14, a configuration of infrared sensor 100 according to a fifth embodiment will be described. The fifth embodiment has the same configuration, manufacturing method, and operation effects as the third embodiment described above, unless otherwise specified. The same configuration as the third embodiment described above is denoted by the same reference sign and will not be further elaborated.

As illustrated in FIG. 14, infrared sensor 100 according to the present embodiment further includes antireflective film 6. Antireflective film 6 is arranged on the side opposite to second semiconductor substrate 2 with respect to first main surface 1*a*. Antireflective film 6 covers first back surface 1*b*. Antireflective film 6 is formed to prevent reflection of infrared radiation 1R. Antireflective film 6 may have the same configuration as the configuration of antireflective film 6 described in the first embodiment except for the position where antireflective film 6 is arranged.

The operation effect of the present embodiment will now be described.

In infrared sensor 100 according to the present embodiment, infrared sensor 100 further includes antireflective film 6. Antireflective film 6 is arranged on the side opposite to second main surface 2*a* with respect to first main surface 1*a*. Antireflective film 6 therefore covers first back surface 1*b*. Accordingly, occurrence of a stray light component due to reflection of infrared radiation IR can be suppressed even when infrared radiation IR is incident on infrared detection element 11 from the first back surface 1*b* side of first semiconductor substrate 1. Thus, the incidence of infrared radiation IR scattered in first semiconductor substrate 1 on infrared detection element 11 can be suppressed. The sensitivity of infrared sensor 100 can be enhanced even when infrared radiation IR is incident on infrared detection element 11 from the first back surface 1*b* side of first semiconductor substrate 1.

Sixth Embodiment

Figure 15:
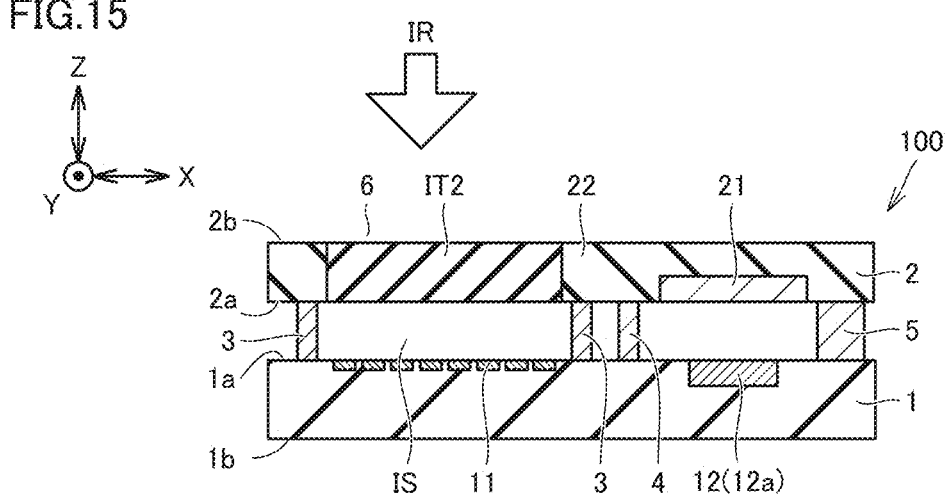
FIG. 15 is a cross-sectional view schematically illustrating a configuration of an infrared sensor according to a sixth embodiment.
Figure 16:
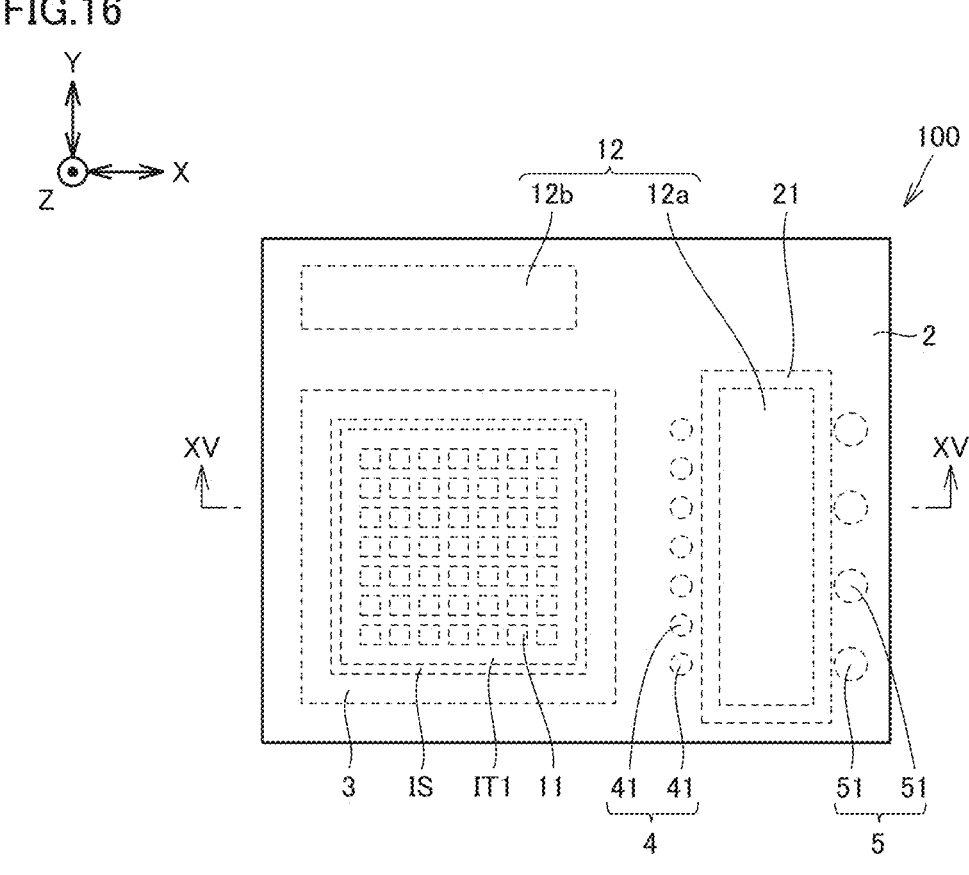
FIG. 16 is a cross-sectional view schematically illustrating the configuration of the infrared sensor according to the sixth embodiment.

Referring to FIG. 15 and FIG. 16, a configuration of infrared sensor 100 according to a sixth embodiment will be described. FIG. 15 is a cross-sectional view along line XV-XV in FIG. 16. The sixth embodiment has the same configuration, manufacturing method, and operation effects as the modification to the first embodiment described above, unless otherwise specified. The same configuration as the modification to the first embodiment described above is denoted by the same reference sign and will not be further elaborated.

As illustrated in FIG. 15, second connection 5 according to the present embodiment has an outer diameter different from that of first connection 4. In the present embodiment, second connection 5 has a larger outer diameter than first connection 4. As illustrated in FIG. 16, each of second connection portions 51 of second connection 5 has an outer diameter different from that of each of first connection portions 41 of first connection 4. Second connection portion 51 has a larger diameter than first connection portion 41.

For example, when the number of first connection portions 41 is as small as 10 to 100, the outer diameter of second connection 5 may be larger than the outer diameter of first connection 4. Thus, the distribution of load applied to first connection 4 and second connection 5 is adjusted when first connection 4 is bonded to first semiconductor substrate 1 and second semiconductor substrate 2. In the present embodiment, the outer diameter of second connection 5 is larger than the outer diameter of first connection 4. However, the outer diameter of second connection 5 may be smaller than the outer diameter of first connection 4.

The number of second connection portions 51 of second connection 5 may be different from the number of first connection portions 41 of first connection 4. In the present embodiment, the number of second connection portions 51 is smaller than the number of first connection portions 41.

For example, when the number of first connection portions 41 is as small as 10 to 100, the number of second connection portions 51 may be larger than the number of first connection portions 41. Thus, the load applied to first connection 4 is distributed to second connection 5. In the present embodiment, the number of second connection portions 51 is smaller than the number of first connection portions 41. However, the number of second connection portions 51 may be larger than the number of first connection portions 41.

The operation effect of the present embodiment will now be described.

In infrared sensor 100 according to the present embodiment, as illustrated in FIG. 15, second connection 5 has an outer diameter different from that of first connection 4. The outer diameter of second connection 5 therefore can be adjusted in accordance with the volume of internal space IS, the outer diameter of first connection 4, and the number of first connection portions 41 (see FIG. 16). Thus, the distribution of load applied to sealing frame 3, first connection 4, and second connection 5 can be adjusted when first semiconductor substrate 1 and second semiconductor substrate 2 are bonded, First semiconductor substrate 1 and second semiconductor substrate 2 therefore can be bonded at high accuracy.

As illustrated in FIG. 16, the number of second connection portions 51 is different from the number of first connection portions 41. The number of second connection portions 51 therefore can be adjusted in accordance with the volume of internal space IS, the outer diameter of first connection 4, the number of first connection portions 41, and the like. The distribution of load applied to sealing frame 3, first connection 4, and second connection 5 can be adjusted when first semiconductor substrate 1 (see FIG. 15) and second semiconductor substrate 2 are bonded. Therefore, first semiconductor substrate 1 (see FIG. 15) and second semiconductor substrate 2 can be bonded at high accuracy.

Embodiments disclosed here should be understood as being illustrative rather than being limitative in all respects. The scope of the present disclosure is shown not in the foregoing description but in the claims, and it is intended that all modifications that come within the meaning and range of equivalence to the claims are embraced here.

REFERENCE SIGNS LIST 1 first semiconductor substrate, 1a first main surface, 2 second semiconductor substrate, 2a second main surface, 3 sealing frame, 4 first connection, 5 second connection, 6 antireflective film, 11 infrared detection element, 13 first substrate portion, 21 signal processing circuit, 22 second substrate portion, 100 infrared sensor, U depressed portion, IR infrared radiation, IS internal space, IT1 first infrared transmitting portion, IT2 second infrared transmitting portion, P second main surface portion.

The invention claimed is:

1. An infrared sensor comprising:
   a first semiconductor substrate including a first main surface and an infrared detection element disposed at the first main surface;
   a second semiconductor substrate including a second main surface facing the first main surface, and a signal processing circuit to process a signal of the infrared detection element;
   a sealing frame connected to the first semiconductor substrate and the second semiconductor substrate, surrounding the infrared detection element disposed at the first main surface, and forming an internal space that is hermetically sealed by the first main surface, the infrared detection element, and the second main surface; and
   a first connection disposed on the first main surface, located outside the sealing frame, and electrically connecting the infrared detection element and the signal processing circuit, wherein
   the internal space is hermetically sealed by the first main surface, the infrared detection element, the second main surface, and the sealing frame, and
   each of the sealing frame and the first connection is sandwiched between the first main surface and the second main surface, and
   the signal processing circuit is disposed in a region outside the internal space.

2. The infrared sensor according to claim 1, further comprising an antireflective film disposed on a side opposite to the second semiconductor substrate with respect to the first main surface,
   wherein the antireflective film prevents reflection of infrared radiation.

3. The infrared sensor according to claim 1, wherein the first semiconductor substrate includes a first substrate portion and a first infrared transmitting portion to transmit infrared radiation more than the first substrate portion, and
   the first infrared transmitting portion faces the infrared detection element.

4. The infrared sensor according to claim 1, further comprising an antireflective film disposed on a side opposite to the first semiconductor substrate with respect to the second main surface,
   wherein the antireflective film prevents reflection of infrared radiation.

5. The infrared sensor according to claim 1, wherein the second semiconductor substrate includes a second substrate portion and a second infrared transmitting portion to transmit infrared radiation more than the second substrate portion, and the second infrared transmitting portion faces the infrared detection element.

6. The infrared sensor according to claim 1, wherein the second main surface includes a second main surface portion and a depressed portion, and the depressed portion is provided at a position facing the infrared detection element to be depressed from the second main surface portion.

7. The infrared sensor according to claim 1, further comprising a second connection, wherein the second connection is sandwiched between the first main surface and the second main surface.

8. The infrared sensor according to claim 7, wherein the second connection has an outer diameter different from an outer diameter of the first connection.

9. The infrared sensor according to claim 7, wherein the second connection has a higher melting point than the first connection and the sealing frame.

10. The infrared sensor according to claim 1, wherein a material of each of the first connection and the sealing frame has electrical conductivity.

11. The infrared sensor according to claim 1, wherein a material of the first connection is same as a material of the sealing frame.

12. The infrared sensor according to claim 1, wherein the internal space is sealed in a vacuum state.

13. A method of manufacturing an infrared sensor, comprising the steps of:

preparing a first semiconductor substrate including a first main surface and an infrared detection element disposed at the first main surface, a second semiconductor substrate including a second main surface and a signal processing circuit to process a signal of the infrared detection element, a sealing frame, and a first connection; and sandwiching each of the scaling frame and the first connection between the first main surface, the infrared detection element, and the second main surface to form an internal space that is hermetically sealed by the first main surface, the infrared detection element, the second main surface, and the sealing frame, surround, by the sealing frame, the infrared detection element disposed at the first main surface, and dispose the signal processing circuit in a region outside the internal space, and electrically connecting the infrared detection element and the signal processing circuit by the first connection outside the sealing frame.

14. The method of manufacturing an infrared sensor according to claim 13, wherein the internal space is hermetically sealed by the first main surface, the infrared detection element, the second main surface, and the sealing frame in a vacuum atmosphere.

15. The method of manufacturing an infrared sensor according to claim 13, wherein a second connection is further prepared, and the second connection is sandwiched together with the sealing frame and the first connection between the first main surface and the second main surface.

16. An infrared sensor comprising:

a first semiconductor substrate including a first main surface and an infrared detection element disposed at the first main surface;

a second semiconductor substrate including a second main surface facing the first main surface, and a signal processing circuit to process a signal of the infrared detection element;

a sealing frame connected to the first semiconductor substrate and the second semiconductor substrate and surrounding an internal space with the first main surface, the infrared detection element, and the second main surface;

a first connection electrically connecting the infrared detection element and the signal processing circuit, wherein the internal space is hermetically sealed by the first main surface, the infrared detection element, the second main surface, and the sealing frame, and each of the sealing frame and the first connection is sandwiched between the first main surface and the second main surface; and a second connection, wherein the second connection is sandwiched between the first main surface and the second main surface, and the second connection has a higher melting point than the first connection and the sealing frame.

17. The infrared sensor according to claim 16, wherein the second connection is sandwiched between the first main surface and the second main surface.

* * * * *